US012537525B2

(12) United States Patent
Wang et al.

(10) Patent No.: US 12,537,525 B2
(45) Date of Patent: Jan. 27, 2026

(54) BUFFER CIRCUIT WITH THRESHOLD VOLTAGE CANCELLATION

(71) Applicant: Analog Devices, Inc., Wilmington, MA (US)

(72) Inventors: Wei Wang, Colorado Springs, CO (US); Thomas A Spargo, Colorado Springs, CO (US); Michael E. Harrell, Colorado Springs, CO (US); Angel Rael, Colorado Springs, CO (US)

(73) Assignee: Analog Devices, Inc., Wilmington, MA (US)

( * ) Notice: Subject to any disclaimer, the term of this patent is extended or adjusted under 35 U.S.C. 154(b) by 52 days.

(21) Appl. No.: 18/525,655

(22) Filed: Nov. 30, 2023

(65) Prior Publication Data

US 2025/0183893 A1   Jun. 5, 2025

(51) Int. Cl.
*H03K 19/003* (2006.01)
*H03K 3/356* (2006.01)
*H03K 19/0185* (2006.01)

(52) U.S. Cl.
CPC . *H03K 19/00384* (2013.01); *H03K 3/356017* (2013.01); *H03K 19/018514* (2013.01)

(58) Field of Classification Search
CPC ....... H03K 19/00384; H03K 3/356017; H03K 19/018514; H03K 19/00369; H03K 3/356104; H03K 19/018521
See application file for complete search history.

(56) References Cited

U.S. PATENT DOCUMENTS

2005/0017769 A1\* 1/2005 Nakashima .... H03K 19/018521
327/112

FOREIGN PATENT DOCUMENTS

EP          3886318          3/2025

\* cited by examiner

*Primary Examiner* — Jung Kim
(74) *Attorney, Agent, or Firm* — Schwegman Lundberg & Woessner, P.A.

(57) ABSTRACT

Various techniques are described to level shift an input signal from an input node to an output node of an open-loop voltage buffer circuit so that a DC offset voltage and a temperature-dependent voltage from the level shifter circuitry are mutually canceled out. By using these techniques, the output voltage of the buffer circuit tracks the input voltage with no DC offset voltage and no temperature drift.

15 Claims, 6 Drawing Sheets

BUFFER CIRCUIT WITH THRESHOLD VOLTAGE CANCELLATION

FIELD OF THE DISCLOSURE

This document relates to the field of electronic buffer circuits.

BACKGROUND

Electronic buffer circuits, also known as buffer amplifiers, or voltage followers, play a crucial role in electronic systems by isolating or separating different stages within a circuit. These circuits are designed to provide high input impedance and low output impedance, thereby preventing signal degradation and maintaining the integrity of the input signal. Buffer circuits are often utilized in various applications, including (but not limited to) audio amplifiers, data transmission, analog-to-digital converters, and sensor interfacing.

An important function of a buffer circuit is to reduce the loading effects on the preceding stage while driving the following stage effectively. By employing a buffer circuit, the impedance mismatch is resolved as the buffer presents a high input impedance, allowing it to draw minimal current from the preceding stage. Additionally, the buffer circuit provides a low output impedance, enabling it to supply the required current to the following stage without distortion or loss of signal amplitude.

SUMMARY OF THE DISCLOSURE

This disclosure describes various techniques to level shift an input signal from an input node to an output node of an open-loop voltage buffer circuit so that a DC offset voltage and a temperature-dependent voltage from the level shifter circuitry are mutually canceled out. By using these techniques, the output voltage of the buffer circuit tracks the input voltage with no DC offset voltage and no temperature drift.

In some aspects, this disclosure is directed to an open-loop buffer circuit with threshold voltage cancellation between an input and an output, the open-loop buffer circuit comprising: an input node configured to receive an input voltage; an output node configured to generate an output voltage that is the same as the input voltage; a first pair of transistors including: a first field-effect transistor having a gate terminal coupled with the input node and configured to receive the input voltage; a second field-effect transistor coupled with the first field-effect transistor and configured and arranged such that a voltage at a gate terminal of the second field-effect transistor is the same as the input voltage; and a second pair of transistors including: a third transistor coupled with the second field-effect transistor; and a fourth transistor coupled with the third transistor and to the output node, wherein the third and fourth transistors are configured and arranged such that the output voltage is the same as the voltage at the gate terminal of the second field-effect transistor.

In some aspects, this disclosure is directed to an open-loop buffer circuit with threshold voltage cancellation between an input and an output, the open-loop buffer circuit comprising: an input node configured to receive an input voltage; an output node configured to generate an output voltage that is the same as the input voltage; a first pair of transistors including: a first field-effect transistor having a gate terminal coupled with the input node and configured to receive the input voltage; a second field-effect transistor coupled with the first field-effect transistor and configured and arranged such that a voltage at a gate terminal of the second field-effect transistor is the same as the input voltage; and a second pair of transistors including: a third transistor coupled with the second field-effect transistor; and a fourth transistor coupled with the third transistor and to the output node, wherein the third and fourth transistors are configured and arranged such that the output voltage is the same as the voltage at the gate terminal of the second field-effect transistor, wherein both the third transistor and the fourth transistor are bipolar junction transistors; a ninth transistor coupled with the first field-effect transistor and the third transistor, wherein a control terminal of the ninth transistor is coupled with a base terminal of the third transistor and a base terminal of the fourth transistor; and a current mirror circuit coupled with the ninth transistor.

In some aspects, this disclosure is directed to an open-loop buffer circuit with threshold voltage cancellation between an input and an output, the open-loop buffer circuit comprising: an input node configured to receive an input voltage; an output node configured to generate an output voltage that is the same as the input voltage; a first pair of transistors including: a first field-effect transistor having a gate terminal coupled with the input node and configured to receive the input voltage; a second field-effect transistor coupled with the first field-effect transistor and configured and arranged such that a voltage at a gate terminal of the second field-effect transistor is the same as the input voltage; and a second pair of transistors including: a third transistor coupled with the second field-effect transistor; and a fourth transistor coupled with the third transistor and to the output node, wherein the third and fourth transistors are configured and arranged such that the output voltage is the same as the voltage at the gate terminal of the second field-effect transistor; wherein the first field-effect transistor and the second field-effect transistor are arranged in a differential pair configuration, wherein the second field-effect transistor is a diode connected transistor; and wherein the first field-effect transistor and the second field-effect transistor are coupled with a shared tail current source.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

In many applications, buffer circuits are used to drive pure capacitive loads. The closed-loop buffer circuit suffers from stability issues when there is a heavy capacitive load. The open-loop buffer circuit can also be used to drive capacitive loads, and it does not have stability issues like closed loop buffer circuits. But, conventional open-loop buffer circuits have unequal input and output voltages. A conventional open-loop voltage buffer circuit has DC offset voltages between the input voltage and the output voltage, due to the threshold or threshold mismatch from level shifters. In addition, the conventional open-loop voltage buffer circuit also has a temperature-dependent offset due to the temperature drift from the threshold voltage of level shifters. There is a need to develop a buffer that does not suffer stability issues when the driver has a heavy capacitive load, and the buffer has zero offset voltage between the input and output node.

A source follower is the most common open-loop voltage buffer circuit. Due to the threshold voltage, the output voltage of the source follower has a DC offset voltage from the input signal. The output voltage also presents a temperature dependent property due to the temperature shift of the threshold voltage of the source follower.

A diamond source follower is another type of open-loop voltage buffer circuit and has a class AB output stage, which provides a source and sink capability to the load. Due to the threshold mismatch and temperature coefficient mismatch between the transistors, e.g., NMOS and PMOS transistors, the output voltage has a DC offset and is temperature dependent.

This disclosure describes various techniques to level shift an input signal from an input node to an output node of an open-loop voltage buffer circuit so that a DC offset voltage and a temperature-dependent voltage from the level shifter circuitry are mutually canceled out. By using these techniques, the output voltage of the buffer circuit tracks the input voltage with no DC offset voltage and no temperature drift.

Figure 1:
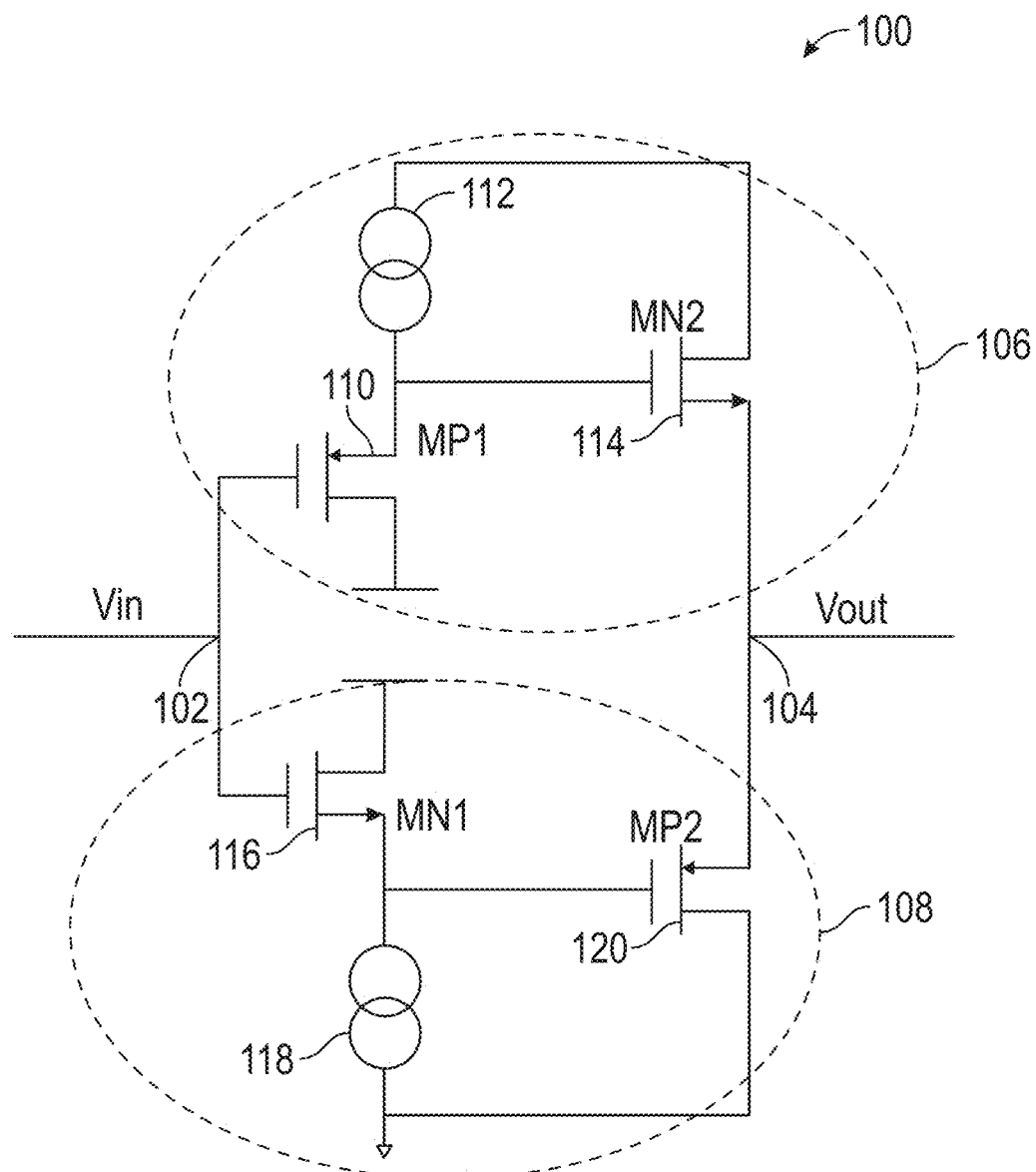
FIG. 1 is a schematic diagram of an example of a conventional open-loop buffer circuit.

FIG. 1 is a schematic diagram of an example of a conventional open-loop buffer circuit. The open-loop buffer circuit 100 of FIG. 1 is configured to receive an input voltage VIN at an input node 102 generate an output voltage VOUT at an output node 104.

The open-loop buffer circuit 100 is arranged in a source follower configuration and includes a top portion 106 and a bottom portion 108. The top portion 106 includes a p-type FET 110, a current source 112, and an n-type FET 114, such as arranged in a PMOS source follower first stage and an NMOS source follower second stage. The bottom portion 108 includes an n-type FET 116, a current source 118, and a p-type FET 120, such as arranged in an NMOS source follower first stage and a PMOS source follower second stage.

The open-loop buffer circuit 100 includes both sourcing and sinking capability. However, one disadvantage of the configuration of the open-loop buffer circuit 100 is that the output voltage VOUT does not equal the input voltage VIN. When the input voltage VIN increases, the output voltage VOUT increases. But, because the threshold voltage VGS of a p-type FET is generally different from the threshold voltage VGS of an n-type FET and the temperature coefficient of the n-type FET and p-type FET are different, the output voltage VOUT is not the same as the input voltage VIN.

For example, in FIG. 1, between the input node 102 and the output node 104 in the top portion 106, there is an increase in one VGS and a decrease in one VGS. But, because the two transistors are different types, the output voltage VOUT will likely not be the same as the input voltage VIN. The bottom portion 108 is similar, where there is a decrease in one VGS and an increase in one VGS but because the two transistors are different types, the output voltage VOUT will likely not be the same as the input voltage VIN.

Figure 2:
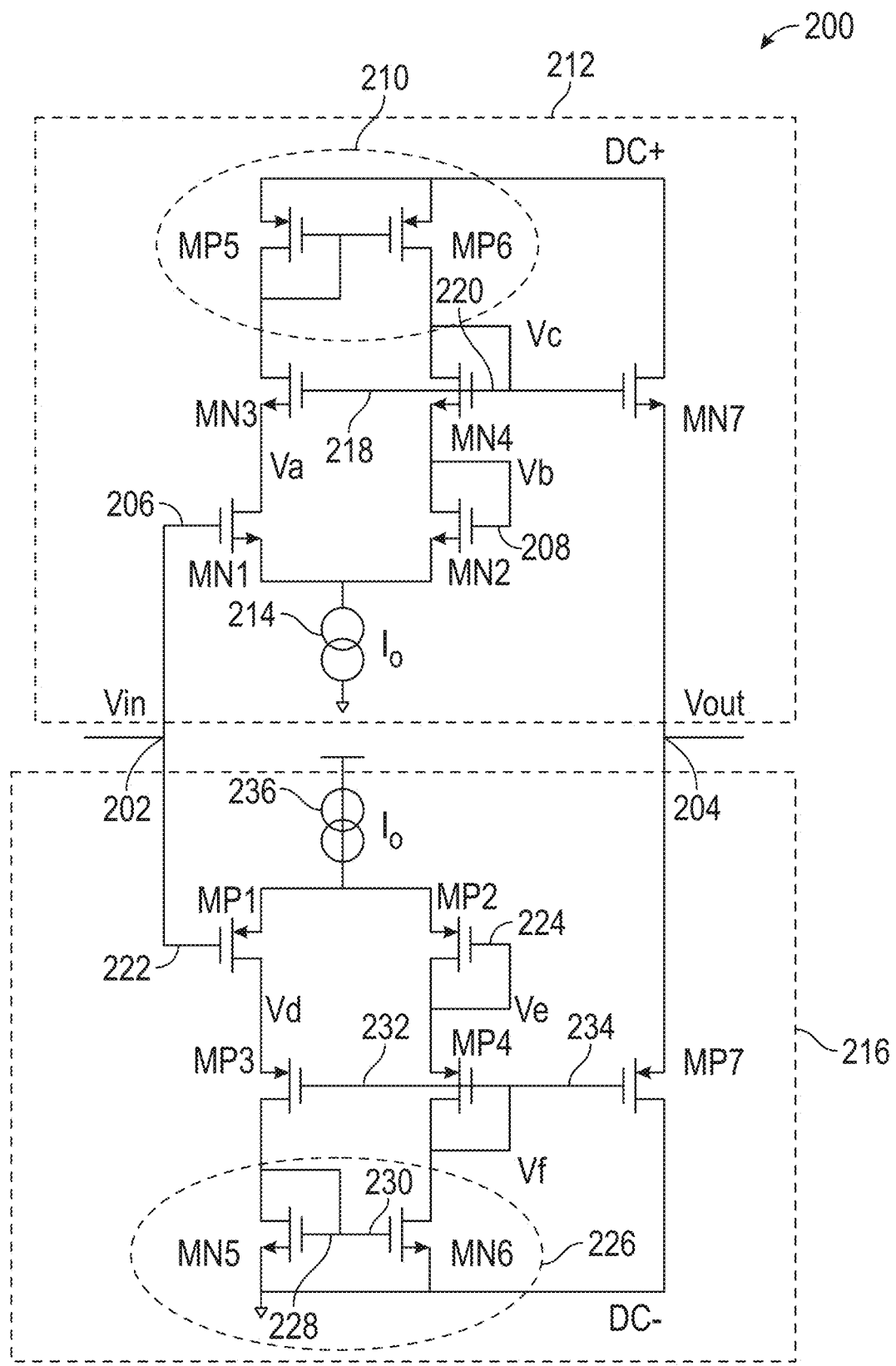
FIG. 2 is a schematic diagram of an example of an open-loop buffer circuit with threshold voltage cancellation between an input and an output using various techniques of this disclosure.

FIG. 2 is a schematic diagram of an example of an open-loop buffer circuit with threshold voltage cancellation between an input and an output using various techniques of this disclosure. The open-loop buffer circuit 200 of FIG. 2 includes an input node 202 configured to receive an input voltage VIN and an output node 204 configured to generate an output voltage VOUT that is the same as the input voltage.

The open-loop buffer circuit 200 includes a first pair of transistors including a first field-effect transistor MN1 and a second field-effect transistor MN2. The first field-effect transistor MN1 has a gate terminal 206 coupled with the input node 202 and configured to receive the input voltage VIN. The open-loop buffer circuit 200 is considered "open loop" because the circuit does not feedback the voltage VOUT to the input node 202. An open loop configuration can be desirable to reduce or prevent oscillations or reflections that may be result from a capacitive load or transmission line.

In some examples, the second field-effect transistor MN2 is a diode connected transistor. The second field-effect transistor MN2 is coupled with the first field-effect transistor MN1 and is configured and arranged such that a voltage Vb at its gate terminal 208 is the same as the input voltage. Because the first field-effect transistor MN1 and the second field-effect transistor MN2 are the same type, e.g., n-type, the threshold VGS of MN1 and MN2 will be the same and vary the same with temperature. As such, the voltage Vb=VIN−VGS_MN1+VGS_MN2=VIN.

The open-loop buffer circuit 200 includes a second pair of transistors including a third transistor MN4 coupled with the second field-effect transistor MN2 and a fourth transistor MN7 coupled with the third transistor MN4 and to the output node 204. In some examples, the third transistor MN4 is a diode connected transistor. The third and fourth transistors MN4, MN7 are configured and arranged such that the output voltage VOUT is the same as the voltage Vb at the gate terminal 208 of the second field-effect transistor MN2. Because the third transistor MN4 and the fourth transistor MN7 are the same type, e.g., n-type, the threshold VGS of MN4 and MN7 will be the same and will vary the same with temperature. As such, the output voltage VOUT=Vb+VGS_MN4−VGS_MN7=Vb.

The input node 202 connects to the gate of the first field-effect transistor MN1. The transistors MN1, MN2, MN3, MN4, and MN7 level shift the input voltage VIN so that the output voltage VOUT=VIN−VGS_MN1+VGS_MN2+VGS_MN4−VGS_MN7. By using these techniques, the output voltage VOUT of the open-loop buffer circuit 200 tracks the input voltage VIN with no DC offset voltage and no temperature drift.

Figure 4:
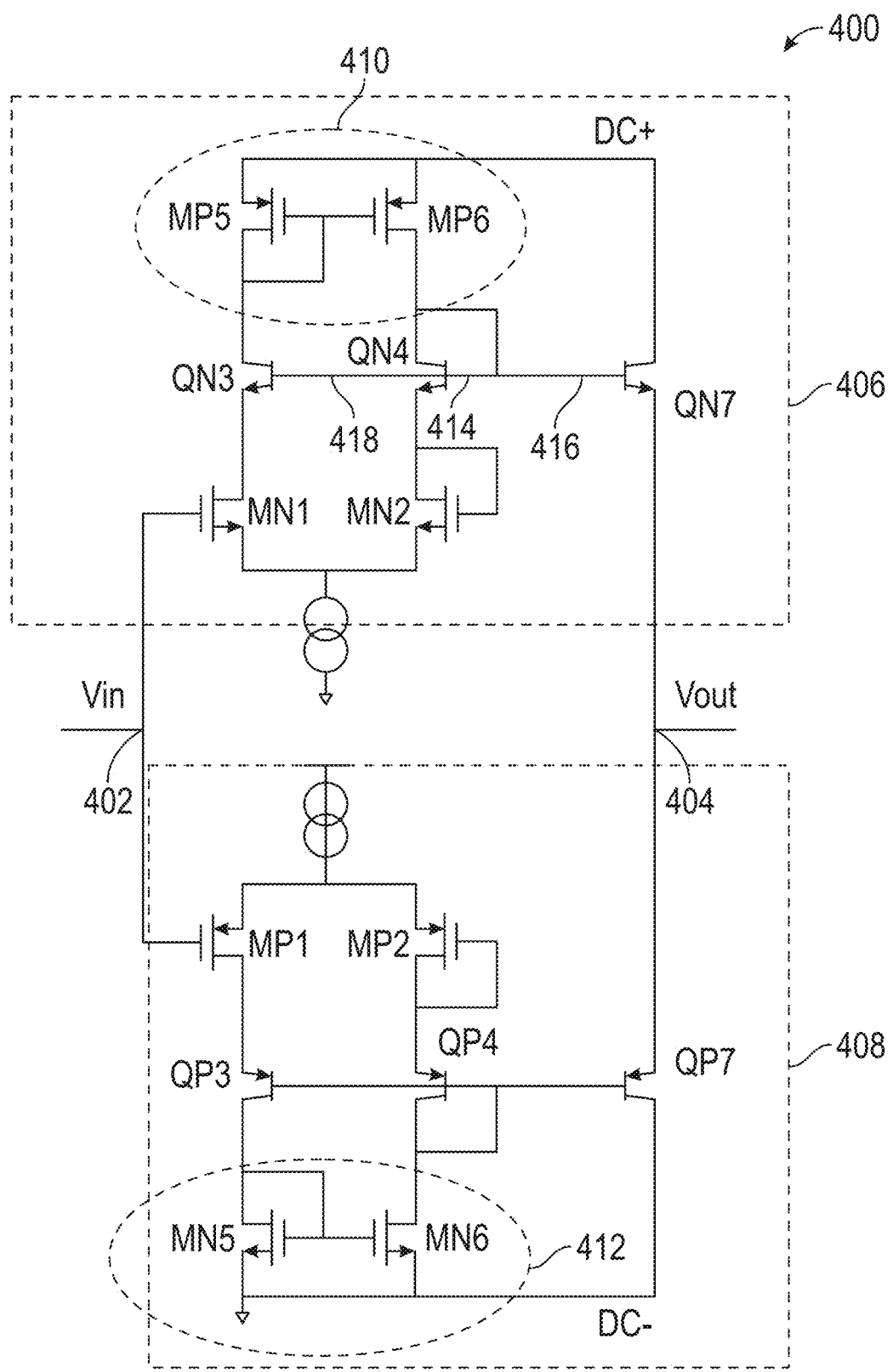
FIG. 4 is a schematic diagram of another example of an open-loop buffer circuit with threshold voltage cancellation between an input and an output using various techniques of this disclosure.

In some examples, the open-loop buffer circuit 200 further includes a current mirror circuit 210. For example, the current mirror circuit 210 includes a diode connected field-effect transistor MP5 having its gate terminal (e.g., a control terminal) coupled with a gate terminal (e.g., a control terminal) of a field-effect transistor MP6. A drain terminal of the field-effect transistor MP5 is coupled with a drain terminal of a transistor MN3, and a drain terminal of the field-effect transistor MP6 is coupled with a drain terminal of the third transistor MN4. A source terminal of the field-effect transistor MN3 is coupled with a drain terminal of the first field-effect transistor MN1. Further, a control terminal, e.g., a gate terminal 218, of the transistor MN3 is coupled with a control terminal, e.g., a gate terminal 220, of the third transistor MN4. Although the transistors MN3 and MN4 are shown as field-effect transistors, in other examples, the transistors MN3 and MN4 can be implemented as bipolar junction transistors, such as shown in FIG. 4.

The current mirror circuit 210 equalizes the current in the first field-effect transistor MN1 and the second field-effect transistor MN2. Therefore, the voltage Va=Vb, VGS_MN1=VGS_MN2, VGS_MN3=VGS_MN4=VGS_MN7, and VOUT=VIN.

In some examples, the first field-effect transistor MN1 and the second field-effect transistor MN2 are arranged in a differential pair configuration, where their source terminals are connected and the second field-effect transistor MN2 is a diode connected transistor, such as shown in FIG. 2. In some such examples, the first field-effect transistor MN1 and the second field-effect transistor MN2 are coupled with a shared tail current source 214.

The top portion 212 of the open-loop buffer circuit 200 is configured to source current. For example, the fourth transistor MN7 is configured to source current to the output node 204. In some examples, it can be desirable to alternatively or additionally sink current. A bottom portion 216 of the open-loop buffer circuit 200 is configured to sink current.

The bottom portion 216 is similar to the top portion 212. The open-loop buffer circuit 200 includes a third pair of transistors including a fifth field-effect transistor MP1 and a sixth field-effect transistor MP2. The fifth field-effect transistor MP1 has a gate terminal 222 coupled with the input node 202 and configured to receive the input voltage VIN.

In some examples, the sixth field-effect transistor MP2 is a diode connected transistor. The sixth field-effect transistor MP2 is coupled with the fifth field-effect transistor MP1 and configured and arranged such that a voltage at a gate terminal 224 of the sixth field-effect transistor MP2 is the same as the input voltage VIN. Because the fifth field-effect transistor MP1 and the sixth field-effect transistor MP2 are the same type, e.g., p-type, the threshold VGS of MP1 and MP2 will be the same and vary the same with temperature. As such, the voltage Ve=VIN+VGS_MP1–VGS_MP2=VIN.

The open-loop buffer circuit 200 includes a fourth pair of transistors including a seventh transistor MP4 coupled with the sixth field-effect transistor MP2 and an eighth transistor MP7 coupled with the seventh transistor MP4 and to the output node 204. In some examples, the seventh transistor MP4 is a diode connected transistor. The seventh and eighth transistors MP4, MP7 are configured and arranged such that the output voltage VOUT is the same as the voltage Ve at the gate terminal 224 of the sixth field-effect transistor MP2. Because the seventh transistor MP4 and the eighth transistor MP7 are the same type, e.g., p-type, the threshold VGS of MP4 and MP7 will be the same and vary the same with temperature. As such, the output voltage VOUT=Ve–VGS_MP4+VGS_MN7=Ve.

The input node 202 connects to the gate of the fifth field-effect transistor MP1. The transistors MP1, MP2, MP3, MP4, and MP7 level shift the input voltage VIN so that the output voltage VOUT=VIN+VGS_MP1–VGS_MP2–VGS_MP4+VGS_MP7.

As mentioned above, the bottom portion 216 of the open-loop buffer circuit 200 is configured to sink current. For example, the eighth transistor MP7 is configured to sink current from the output node 204.

In some examples, the bottom portion 216 includes a current mirror circuit 226. For example, the current mirror circuit 226 includes a diode connected field-effect transistor MN5 having its gate terminal 228 (e.g., control terminal) coupled with a gate terminal 230 of a field-effect transistor MN6. A drain terminal of the field-effect transistor MN5 is coupled with a drain terminal of a field-effect transistor MP3, and a drain terminal of the field-effect transistor MN6 is coupled with a drain terminal of the seventh transistor MP4. A source terminal of the transistor MP3 is coupled with a drain terminal of the fifth field-effect transistor MP1. Further, a gate terminal 232 of the transistor MP3 is coupled with a gate terminal 234 of the seventh transistor MP4. Although the transistors MP3 and MP4 are shown as field-effect transistors, in other examples, the transistors MP3 and MP4 can be implemented as bipolar junction transistors, such as shown in FIG. 4.

The current mirror MN5 and MN6 equalize the current in MP1 and MP2. Therefore Vd=Ve, VGS_MP1=VGS_MP2, VGS_MP3=VGS_MP4=VGS_MP7, and VOUT=VIN.

In some examples, the fifth field-effect transistor MP1 and the sixth field-effect transistor MP2 are arranged in a differential pair configuration, where their source terminals are connected and the sixth field-effect transistor MP2 is a diode connected transistor, such as shown in FIG. 2. In some such examples, the fifth field-effect transistor MP1 and the sixth field-effect transistor MP2 are coupled with a shared tail current source 236.

The input node 202 of the open-loop buffer circuit 200 is a high impedance node, and the open-loop buffer circuit 200 is a class AB architecture. The output voltage VOUT tracks the input voltage VIN with no DC offset voltage and no temperature dependent offset.

In the example shown in FIG. 2, the first field-effect transistor MN1 and the second field-effect transistor MN2 are both n-type transistors, and the fifth field-effect transistor MP1 and the sixth field-effect transistor MP2 are both p-type transistors. Alternatively, the first field-effect transistor MN1 and the second field-effect transistor MN2 can both be p-type transistors, and the fifth field-effect transistor MP1 and the sixth field-effect transistor MP2 can both be n-type transistors.

Figure 3:
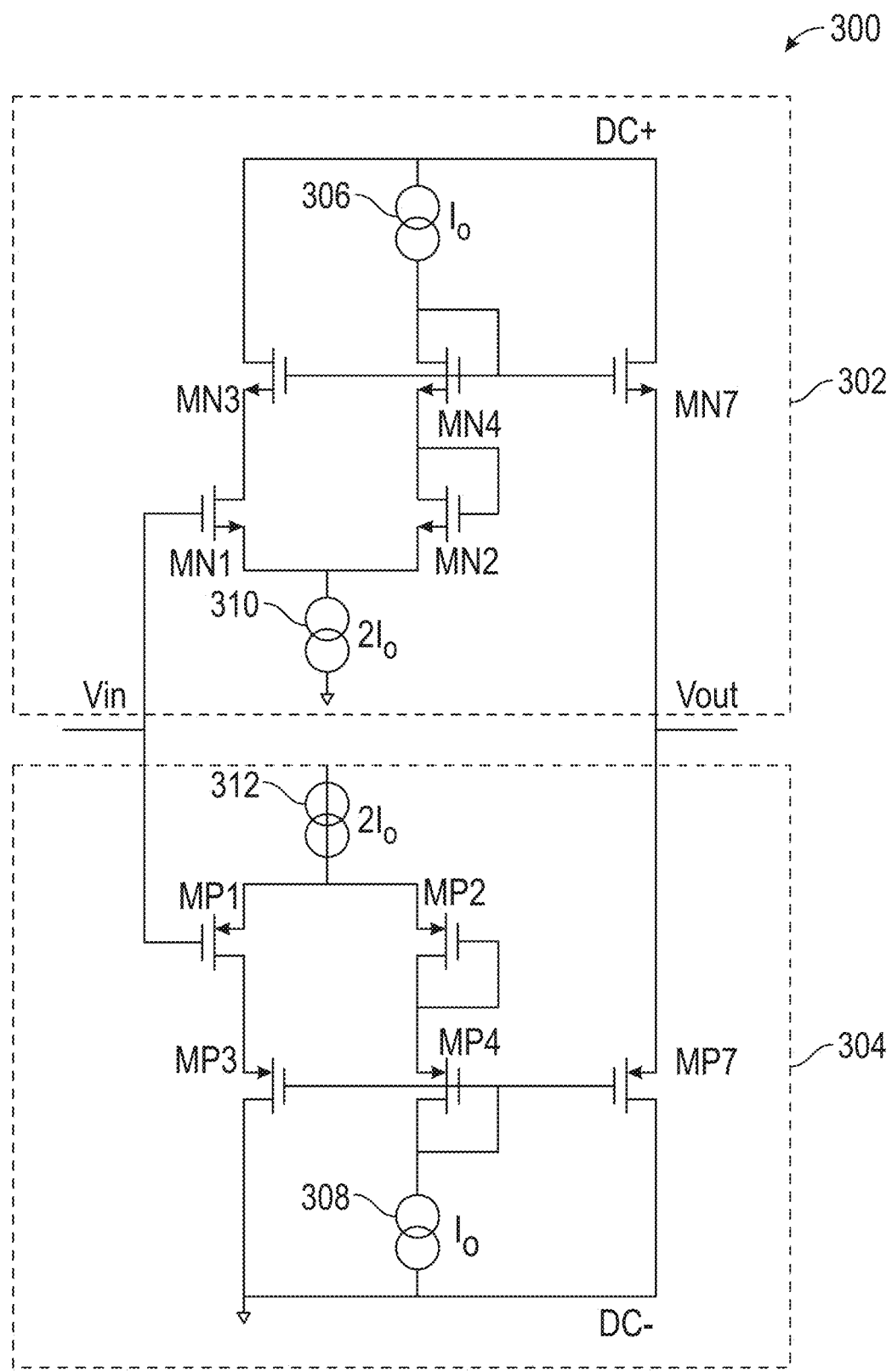
FIG. 3 is a schematic diagram of another example of an open-loop buffer circuit with threshold voltage cancellation between an input and an output using various techniques of this disclosure.

FIG. 3 is a schematic diagram of another example of an open-loop buffer circuit with threshold voltage cancellation between an input and an output using various techniques of this disclosure. The open-loop buffer circuit 300 of FIG. 3 includes some features similar to those of the open-loop buffer circuit 200 of FIG. 2 and, for brevity, those features will not be described in detail again.

In contrast to the open-loop buffer circuit 200 of FIG. 2, the open-loop buffer circuit 300 of FIG. 3 does not include a diode connected transistor coupled to the transistor MN3 in the top portion 302, namely transistor MP5 of FIG. 2. Similarly, the open-loop buffer circuit 300 does not include a diode connected transistor coupled to the transistor MP3 in the bottom portion 304, namely the transistor MN5 in FIG. 2. Instead, the transistor MN3 is coupled directly with the power supply DC+ and the transistor MP3 is coupled directly with the power supply DC−. The top portion 302 includes a current source 306 coupled with a drain terminal of the third transistor MN4. The current source 306 is configured to generate a bias current Io. There is a shared tail current source 310 of 2Io that splits so that the DC bias can be the same between the two branches.

Similarly, the bottom portion 304 includes a current source 308 coupled with a drain terminal of the seventh transistor MP4. The current source 308 is configured to generate a bias current Io. There is a shared tail current source 312 of 2Io that splits so that the DC bias can be the same between the two branches.

FIG. 4 is a schematic diagram of another example of an open-loop buffer circuit with threshold voltage cancellation between an input and an output using various techniques of this disclosure. The open-loop buffer circuit 400 includes an input node 402 configured to receive an input voltage VIN and an output node 404 configured to generate an output voltage VOUT that is the same as the input voltage.

The open-loop buffer circuit 400 of FIG. 4 includes some features similar to those of the open-loop buffer circuit 200 of FIG. 2 and operates similarly. For brevity, those similar features and the operation of the circuit will not be described in detail again.

Unlike the open-loop buffer circuit 200 of FIG. 2, the top portion 406 of the open-loop buffer circuit 400 of FIG. 4 includes both bipolar junction transistors (BJTs) QN3, QN4, and QN7, where each bipolar junction transistor has a threshold voltage VBE. As such, the third transistor QN4 and the fourth transistor QN7 of the top portion 406 are bipolar junction transistors. In contrast, the third transistor MN4 and the fourth transistor MN7 of the top portion 212 of the open-loop buffer circuit 200 of FIG. 2 and the third transistor MN4 and the fourth transistor MN7 of the top portion 302 of the open-loop buffer circuit 300 are field-effect transistors.

Like the open-loop buffer circuit 200 of FIG. 2, the transistors MN1, MN2, QN4, and QN7 level shift the input voltage VIN so that the output voltage VOUT=VIN−VGS_MN1+VGS_MN2+VBE_QN4−VBE_QN7. The two threshold voltages VGS cancel one another and the two threshold voltages VBE cancel one another. By using these techniques, the output voltage VOUT of the open-loop buffer circuit 400 tracks the input voltage VIN with no DC offset voltage and no temperature drift.

Similarly, the bottom portion 408 of the open-loop buffer circuit 400 includes BJTs QP3, QP4, and QP7. In contrast, the transistors MP3, MP4, and MP7 were field-effect transistors in FIGS. 2 and 3. The transistors MP1, MP2, QP4, and QP7 level shift the input voltage VIN so that the output voltage VOUT=VIN+VGS_MP1−GS_MP2−VBE_QP4+VBE_QP7, where the two threshold voltages VGS cancel one another and the two threshold voltages VBE cancel one another.

Like the open-loop buffer circuit 200 of FIG. 2, the open-loop buffer circuit 400 can include one or both of the top portion 406 and the bottom portion 408 to source or sink current, respectively.

The open-loop buffer circuit 400 can further include a current mirror circuit 410 in the top portion 406 formed by the transistors MP5 and MP6, and a current mirror circuit 412 in the bottom portion 408 formed by the transistors MN5 and MN6.

Further, a control terminal, e.g., a base terminal 414, of the transistor QN4 is coupled with a control terminal, e.g., a base terminal 416, of the transistor QN7. When present, a control terminal, e.g., a base terminal 418, of the transistor QN3 can be coupled with the control terminal of the transistor QN4. The control terminals of the transistors QN3, QN4, and QN7 can be similarly coupled.

Figure 5:
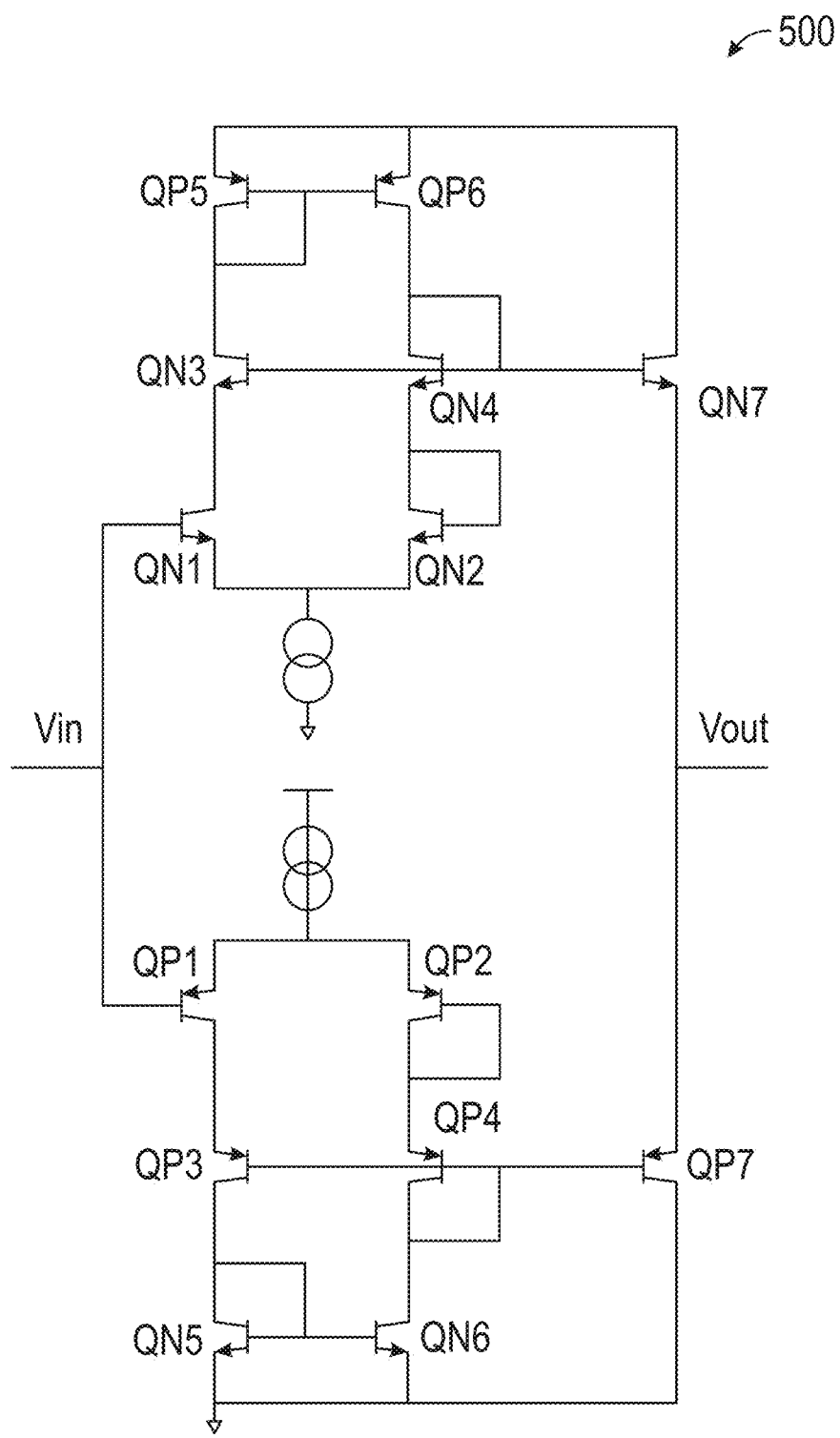
FIG. 5 is a schematic diagram of another example of an open-loop buffer circuit with threshold voltage cancellation between an input and an output using various techniques of this disclosure.

FIG. 5 is a schematic diagram of another example of an open-loop buffer circuit with threshold voltage cancellation between an input and an output using various techniques of this disclosure. In contrast to the open-loop buffer circuit 200 of FIG. 2 that uses only FETs, the open-loop buffer circuit 500 of FIG. 5 uses only BJTs. As such, the level shifting of the input voltage is accomplished using VBE threshold voltages of the BJT devices and not VGS threshold voltage of FET devices (or a combination of the two, like in FIG. 4). For brevity, the operation of the open-loop buffer circuit 500 of FIG. 5 is omitted given its similarity to that of the open-loop buffer circuit 200 of FIG. 2.

Figure 6:
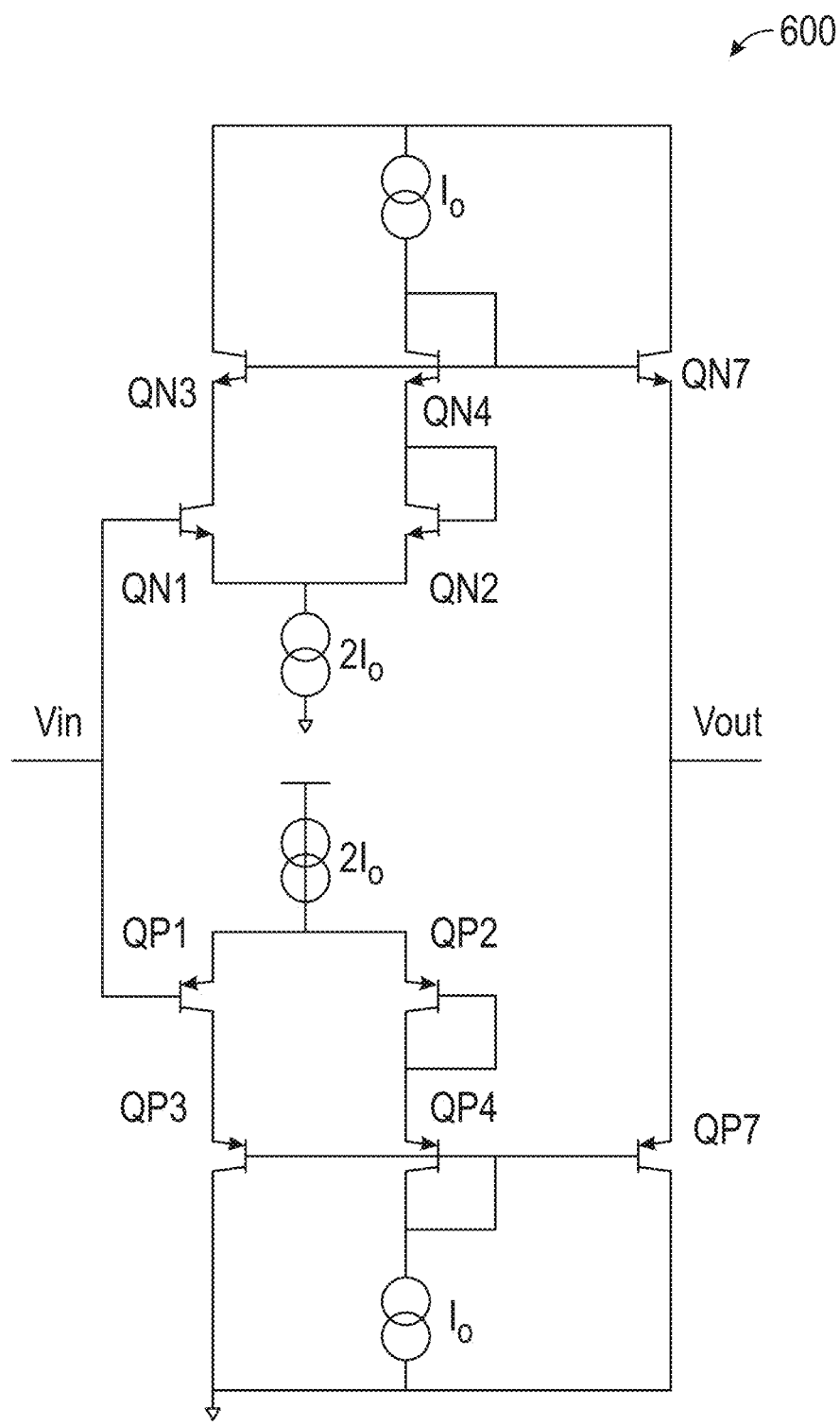
FIG. 6 is a schematic diagram of another example of an open-loop buffer circuit with threshold voltage cancellation between an input and an output using various techniques of this disclosure.

FIG. 6 is a schematic diagram of another example of an open-loop buffer circuit with threshold voltage cancellation between an input and an output using various techniques of this disclosure. In contrast to the open-loop buffer circuit 300 of FIG. 3 that uses only FETs, the open-loop buffer circuit 600 of FIG. 6 uses only BJTs. As such, the level shifting of the input voltage is accomplished using VBE threshold voltages of the BJT devices and not VGS threshold voltage of FET devices (or a combination of the two, like in FIG. 4). For brevity, the operation of the open-loop buffer circuit 600 of FIG. 6 is omitted given its similarity to that of the open-loop buffer circuit 300 of FIG. 3.

The techniques described above level shift an input signal from an input node to an output node of an open-loop voltage buffer circuit so that a DC offset voltage and a temperature-dependent voltage from the level shifter circuitry are mutually canceled out. By using these techniques, the output voltage of the buffer circuit tracks the input voltage with no DC offset voltage and no temperature drift.

Various Notes

Each of the non-limiting claims or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more claims thereof), either with respect to a particular example (or one or more claims thereof), or with respect to other examples (or one or more claims thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more claims thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

What is claimed is:

1. An open-loop buffer circuit with threshold voltage cancellation between an input and an output, the open-loop buffer circuit comprising:
   an input node configured to receive an input voltage;
   an output node configured to generate an output voltage that is the same as the input voltage;
   a first pair of transistors including:
   a first field-effect transistor having a gate terminal coupled with the input node and configured to receive the input voltage;
   a second field-effect transistor coupled with the first field-effect transistor and configured and arranged such that a voltage at a gate terminal of the second field-effect transistor is the same as the input voltage; and
   a second pair of transistors including:
   a third transistor coupled with the second field-effect transistor; and
   a fourth transistor coupled with the third transistor and to the output node, wherein the third and fourth transistors are configured and arranged such that the output voltage is the same as the voltage at the gate terminal of the second field-effect transistor.

2. The open-loop buffer circuit of claim 1, comprising:
   a third pair of transistors including:
   a fifth field-effect transistor having a gate terminal coupled with the input node and configured to receive the input voltage;
   a sixth field-effect transistor coupled with the fifth field-effect transistor and configured and arranged such that a voltage at a gate terminal of the sixth field-effect transistor is the same as the input voltage; and
   a fourth pair of transistors including:
   a seventh transistor coupled with the sixth field-effect transistor; and
   an eighth transistor coupled with the seventh transistor and to the output node, wherein the seventh and eighth transistors are configured and arranged such that the output voltage is the same as the voltage at the gate terminal of the sixth field-effect transistor.

3. The open-loop buffer circuit of claim 2, wherein the first field-effect transistor and the second field-effect transistor are both either n-type transistors or p-type transistors, and wherein the fifth field-effect transistor and the sixth field-effect transistor are both either n-type transistors or p-type transistors.

4. The open-loop buffer circuit of claim 1, wherein both the third transistor and the fourth transistor are field-effect transistors.

5. The open-loop buffer circuit of claim 1, wherein both the third transistor and the fourth transistor are bipolar junction transistors.

6. The open-loop buffer circuit of claim 1, comprising:
   a ninth transistor coupled with the first field-effect transistor and the third transistor, wherein a control terminal of the ninth transistor is coupled with a control terminal of the third transistor and a control terminal of the fourth transistor.

7. The open-loop buffer circuit of claim 6, comprising:
   a current mirror circuit coupled with the ninth transistor.

8. The open-loop buffer circuit of claim 2, comprising:
   a current source coupled with the third transistor.

9. The open-loop buffer circuit of claim 2, wherein a source terminal of the first field-effect transistor is coupled with a source terminal of the second field-effect transistor.

10. The open-loop buffer circuit of claim 1, wherein the second field-effect transistor is a diode connected transistor, and wherein the third transistor is a diode connected transistor.

11. The open-loop buffer circuit of claim 1, wherein the first field-effect transistor and the second field-effect transistor are arranged in a differential pair configuration, and wherein the second field-effect transistor is a diode connected transistor.

12. The open-loop buffer circuit of claim 11, wherein the first field-effect transistor and the second field-effect transistor are coupled with a shared tail current source.

13. An open-loop buffer circuit with threshold voltage cancellation between an input and an output, the open-loop buffer circuit comprising:
- an input node configured to receive an input voltage;
- an output node configured to generate an output voltage that is the same as the input voltage;
- a first pair of transistors including:
- a first field-effect transistor having a gate terminal coupled with the input node and configured to receive the input voltage;
- a second field-effect transistor coupled with the first field-effect transistor and configured and arranged such that a voltage at a gate terminal of the second field-effect transistor is the same as the input voltage; and
- a second pair of transistors including:
- a third transistor coupled with the second field-effect transistor; and
- a fourth transistor coupled with the third transistor and to the output node, wherein the third and fourth transistors are configured and arranged such that the output voltage is the same as the voltage at the gate terminal of the second field-effect transistor;
- wherein the first field-effect transistor and the second field-effect transistor are arranged in a differential pair configuration, wherein the second field-effect transistor is a diode connected transistor; and
- wherein the first field-effect transistor and the second field-effect transistor are coupled with a shared tail current source.

14. The open-loop buffer circuit of claim 13, comprising:
- a third pair of transistors including:
- a fifth field-effect transistor having a gate terminal coupled with the input node and configured to receive the input voltage;
- a sixth field-effect transistor coupled with the fifth field-effect transistor and configured and arranged such that a voltage at a gate terminal of the sixth field-effect transistor is the same as the input voltage; and
- a fourth pair of transistors including:
- a seventh transistor coupled with the sixth field-effect transistor; and
- an eighth transistor coupled with the seventh transistor and to the output node, wherein the seventh and eighth transistors are configured and arranged such that the output voltage is the same as the voltage at the gate terminal of the sixth field-effect transistor.

15. The open-loop buffer circuit of claim 14, wherein the first field-effect transistor and the second field-effect transistor are both either n-type transistors or p-type transistors, and wherein the fifth field-effect transistor and the sixth field-effect transistor are both either n-type transistors or p-type transistors.

* * * * *